SEMICONDUCTOR DEVICES AND METHOD OF MANUFACTURING THEM

Filed Aug. 17, 1954 2 Sheets-Sheet 1

Aug. 12, 1958 R. GREMMELMAIER ET AL 2,847,335

SEMICONDUCTOR DEVICES AND METHOD OF MANUFACTURING THEM

Filed Aug. 17, 1954 2 Sheets-Sheet 2

United States Patent Office
2,847,335
Patented Aug. 12, 1958

2,847,335

SEMICONDUCTOR DEVICES AND METHOD OF MANUFACTURING THEM

Rolf Gremmelmaier and Heinrich Welker, Erlangen, Germany, assignors to Siemens-Schuckertwerke Aktiengesellschaft, Berlin-Siemensstadt, Germany, a corporation of Germany Application August 17, 1954, Serial No. 450,459

Claims priority, application Germany September 15, 1953

15 Claims. (Cl. 148—1.5)

Figure 1:
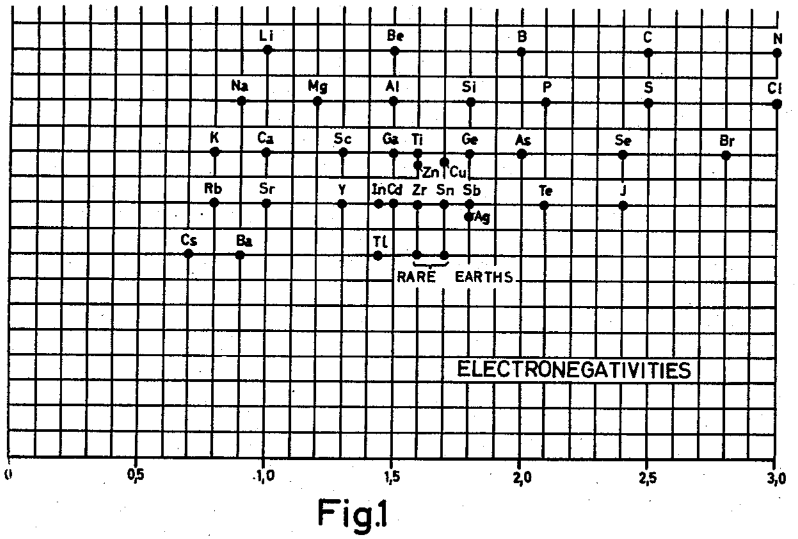
Figure 2:
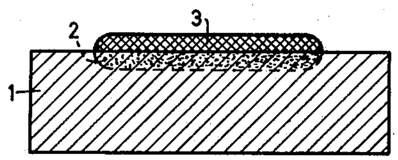
Figure 2A:
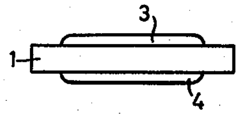
Figure 3:
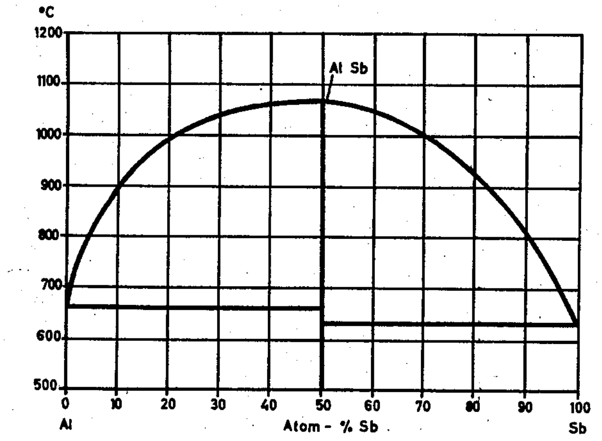
Figure 4:
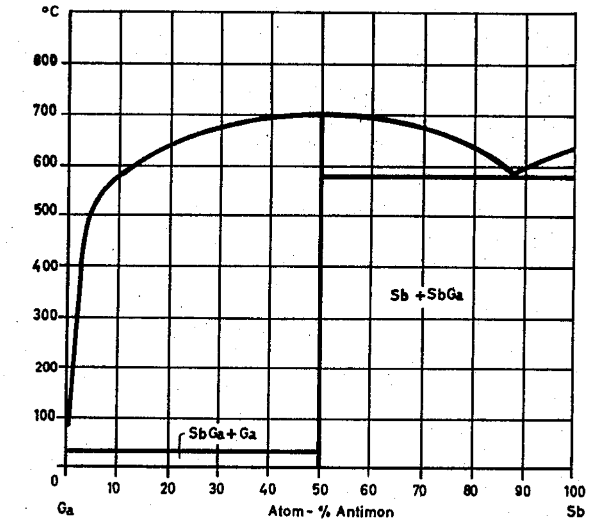
Figure 5:
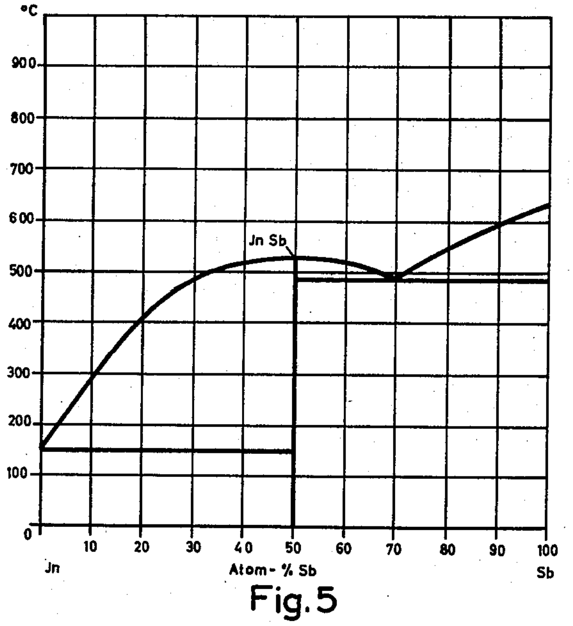

Our invention relates to electric semiconductor devices comprising a semiconductor body joined with electrodes, and is described hereinafter with reference to the drawing in which Fig. 1 is a table of electronegativity values, Fig. 2 is a schematic cross-sectional view of a semiconductor device made according to the invention, Fig. 2a shows schematically a semiconductor device according to the invention and having two surface electrodes, and Figs. 3 to 5 are three respective phase diagrams of quasi-binary systems involved in the present invention.

The invention has for its main object to afford imparting to an electric semiconductor device accurately predetermined electric properties as a result of the choice of the semiconductor body and electrodes and the manner in which one or more of the electrodes are joined with the semiconductor body. The invention enables the production of a diversity of semi-conductor devices differing from one another in degree and quality of electrical characteristics to a predetermined extent and within a wider range than obtainable by use of the elementary semiconductor substances silicon and germanium, heretofore predominantly employed.

It is known to join an elementary semiconductor by fusion with an electrode consisting essentially of donor or acceptor atoms. Germanium p-n junction rectifiers, for instance, have thus been provided with electrodes of metallic indium. Indium acts as an acceptor in germanium. That is, a defect electron or hole occurs for each indium atom dissolved in germanium. Relating to this example of a binary system of germanium-indium, the formation of the electrode junction by fusion can be explained as follows.

When the indium, in contact with the carrier body of germanium, is heated and in liquid condition, it is capable of dissolving a portion of the germanium body. Consequently, the molten droplet formed on the carrier body consists of germanium as well as indium. During the subsequent cooling of the droplet the solubility of germanium in indium decreases so that an increasing amount of the dissolved germanium is segregated in solid form. The segregating germanium grows up from the carrier body of germanium because this body acts as a crystal germ. The electrical properties of the grown germanium, however, may be essentially distinct from those of the carrier body because, during segregation, indium atoms are built as acceptors into the germanium lattice. Consequently, if the carrier body is n-conductive, the segregated portion of the germanium may be p-conductive so that a p-n junction suitable for rectifier and transistor application is produced. Only after the germanium is separated can the indium metal solidify to form the exterior electrode. Such a contact junction has been called an "acceptor contact," as distinct from a "donor contact" wherein the electrode material consists essentially of atoms that act as donors in the semiconductor.

The above-described method, as heretofore known, is predicated upon the presence of a binary phase system of elements but is not generally applicable to tertiary or quaternary systems. For instance, when attempting to fuse electrode material onto an ordinary compounded carrier body, the material may form different chemical compounds with the respective component elements of the carrier and, since these compounds differ from each other in electric properties, a semiconductor device of defined and useful electrical properties, such as a p-n junction, will not result. Besides, compounds whose component elements form solid solutions in each other are not amenable to the electrode fusion method for any apparent useful purposes.

As a result of a comprehensive investigation, however, we have discovered that certain semiconductive compounds, namely those with predominantly homopolar bonds, behave like elements relative to their solubility with electrode substances. That is, we found that, relative to the substances applicable as electrode materials, the phase system which the predominantly homopolarly-bonded semiconductor compound forms with the electrode substance is a quasi-binary system; and we discovered that this phenomenon permits applying the electrode fusion method in such a manner that a variety of desirable electrical properties in a variety of degrees can be selectively produced and accurately predetermined in the semiconductor device by the method and components used for joining the semiconductor body with its electrode or electrodes. The compounding proportions can be calculated from the electronegativity of the individual elements according to L. Pauling in his treatise entitled "The Nature of the Chemical Bond," Oxford University Press, London (1950). Pauling does not indicate the electronegativity values for all elements applicable as components of semiconductive compounds of predominantly homopolar character. For that reason, a complete compilation of the here pertinent values of electronegativity is presented in Fig. 1. The various elements, arranged in accordance with the periodic system of elements, are designated by their chemical symbols. The abscissa indicates values of electronegativity.

A semiconductive compound of a predominantly homopolar character, as to be used for the purposes of the invention, is defined as a compound whose part of homopolar binding exceeds that of the heteropolar one, as distinct from compounds of predominantly heteropolar character. The latter are not applicable to the invention because of excessive ionic conduction in addition to the above-mentioned fundamental difficulties generally encountered with other than binary semiconductor-electrode systems, including the mutual solubility of the components in the solid state. That is, the quasi-binary system possess the important property that in the liquid phase, within certain limits, there exists solubility between the semiconductive compound on the one hand and the electrode material on the other hand, while during cooling a separation of the phases occurs. This is to be understood in the metallurgical-thermodynamical sense; that is, a slight solubility in the solid condition—below 5%—is not excluded. Thus, in general, a solid crystal of a semiconductive compound segregated from a solution of that compound in the electrode material retains traces of the electrode material. This property has been observed to a conspicuous degree with semiconducting compounds of type $A_{III}B_V$ consisting of an element of the third subgroup of the periodic system comprising aluminum, gallium and indium, and an element of the fifth subgroup comprising nitrogen, phosphorus, arsenic, antimony. As to details concerning semiconductive compounds of the type $A_{III}B_V$, reference may be had to the copending patent application Serial No. 275,785, filed March 10, 1952, now U. S. Patent No.

2,798,989, by Heinrich Welker, entitled "Semiconductor Devices and Methods of Their Manufacture" and assigned to the assignee of the present invention; and reference may also be had to the article by Heinrich Welker in the German periodical "Naturforschung," Volume 7*a*, number 11, published in 1952.

Further investigation resulted in the surprising discovery that it is possible to use as electrode material a component of the semiconductive compound itself. This possibility was first recognized with compounds of type $A_{III}B_{V}$. It was found that the individual components $A_{III}$ and $B_{V}$ are insoluble up to an extremely high degree in the solid crystallized compound. The extreme insolubility manifests itself electrically by the phenomenon that the electrical properties of a compound $A_{III}B_{V}$ are generally not affected when the compound is produced with some excess of either of its two components.

The just-mentioned property of semiconductive compounds of homopolar character was heretofore completely unknown. Prior literature dealing with such compounds (for instance, PbS and PbSe) describe phenomena from which it was to be concluded that any excess components are soluble in the semiconductive compound.

According to another feature of our invention, therefore, we fuse to a semiconductor compound of predominantly homopolar character an electrode consisting of one of the component elements of the compound, thus taking advantage of the discovery that such a component has no, or only negligible, influence upon the properties of the compound body. More particularly,the process of fusing an electrode onto the semiconductor is carried out in such a manner that the molten component at first dissolves a portion of the semiconductor body and thereafter, during cooling, segregates the compound back onto the carrier body. The electrode material proper, however, commences to segregate and solidify only near the conclusion of the process.

This process will now be more fully described with reference to the example illustrated in Fig. 2. The numeral 1 in Fig. 2 denotes a semiconductor body of homopolar character which, before applying the process, includes the portion denoted by 2. The electrode body fused onto the semiconductor is denoted by 3. After placing the electrode material onto the semiconductor, heat is applied to liquefy the material 3. When liquid, the material 3 dissolves the portion 2 of the semiconductive carrier body 1. Thereafter, the assembly is permitted to cool. During cooling, the portion 2 segregates from the melt as a semiconductor compound. When solidified, the segregated portion 2 has the same lattice structure as the rest of the carrier body with the exception of traces of impurities due to residual, dissolved amounts of electrode material.

Fig. 2*a* illustrates a semiconductor device according to the invention wherein two electrodes 3 and 4 are fused to the semiconductor body 1 of homopolar character. As will be apparent from the following description, the electrodes 3 and 4 may be chosen to provide junctions of different electrical characteristics according to the use to which the device is to be applied.

That the process occurs in the described manner will be recognized from the phase diagram shown in Fig. 3 for the example of aluminum antimonide. In Fig. 3, the abscissa indicates the aluminum (Al) and antimony (Sb) content in atom percent while the ordinate denotes temperature. The curves shown in Fig. 3 are the known liquidus and solidus curves. The phase diagram shows, for instance, how the melting point of Al, used as a surface electrode for example, is increased by increasing dissolution of aluminum antimonide used as the semiconductor body, and rises to 910° C. when 20% AlSb is dissolved. This temperature must be applied if the fused electrode is to contain 20 atom percent of the AlSb (or 10% of Sb). When the assembly is cooled below this temperature, AlSb is first segregated back onto the AlSb carrier body. When the temperature has dropped to the melting point of pure aluminum, the entire amount of AlSb is separated. During further cooling, aluminum metal is separated and solidifies, thus forming the exterior electrode.

For some applications of the invention it is preferable to use as the electrode body an alloy of the semiconductive compound and one of its components, particularly the alloy that corresponds to the eutectic. For instance, when applying the invention to a semiconductor body of gallium antimonide (GaSb) (the phase diagram Ga—Sb is illustrated in Fig. 4), an alloy of 60 atom percent antimony (Sb) and 40% gallium antimonide (GaSb) is preferably employed or, still better, the eutectic alloy consisting of 75 atom percent antimony (Sb) and 25 atom percent gallium antimonide (GaSb). This has the advantage that the percentage of carrier-body material dissolved in the molten electrode material can be given the same dosage as in cases where no eutectic exists. The latter case applies, for instance, to the gallium side of the Ga—Sb diagram (Fig. 4). For elucidating the general applicability of this method, another example, namely the phase diagram of the system indium antimony (In—Sb), is represented in Fig. 5. By this we signify that an electrode body is employed with a semiconductor compound of indium antimonide (In—Sb) which electrode body is an alloy of that compound with one of its components, preferably the alloy that corresponds to the eutectic.

The above described phenomena make it possible to provide the fusion zone 2 (Fig. 2) of the semiconductor body in any desired manner with impurity atoms that determine the electric behavior of the device. For instance, when in the case of aluminum antimonide (AlSb) a donor such as selenium (Se) or tellurium (Te) is added to the aluminum electrode material, then during the segregation of the AlSb some traces of the Se or Te are built into the AlSb lattice. This produces additional electron conductance in the segregated portion 2 of the semiconductor body. If the original carrier body of AlSb were p-conductive, then the semiconductor crystal segregated back onto the carrier body would be n-conductive, provided the Se or Te concentration in that crystal is sufficiently large. Consequently, a p–n junction suitable for rectifier or transistor purposes is produced. If the original semiconductor crystal was already n-conductive, then the n-conductance is augmented in the supplementarily grown crystal portion so that the resulting semiconductor device has a non-rectifying contact from the electrode material to the semiconductive carrier body. The recombination in such a transition may be very large or very small depending upon whether the crystalline structure within the transition is disturbed to a greater or lesser extent. In the first case, a purely ohmic contact is obtained, while in the latter case a non-rectifying contact accompanied by electron injection will exist.

Analogous conditions obtain when acceptor atoms are used instead of donor atoms, or when as electrode material an element $B_{V}$ (of the fifth group), for instance antimony (Sb), is used instead of an element $A_{III}$ (of the third group), for instance aluminum (Al).

According to another feature of our invention, substances that, as such, are neither acceptors nor donors may be added to the above-mentioned electrode materials. For instance, tin may thus be used as an addition to the electrode material for a semiconductor of AlSb. In such cases, the resulting contact junction is likewise free of rectifying effects and is usually purely ohmic in character, i. e. is not accompanied by additional carrier injection.

The use of a component of a semiconductor compound as an electrode material in general, as well as the last-discussed example in particular, is not limited to semiconductive compounds of the type $A_{III}B_{V}$. The above-described methods are analogously also applicable to semiconductor bodies of the type $A_{IV}B_{VI}$ (compounds of an element of the fourth group with an element of the sixth group), for instance, PbS, PbSe, PbTe, or to semiconductor bodies of the type $A_{II}B_{IV}$ (compounds of an element of the second group with an element of the fourth group) such as $Mg_2Si$, $Mg_2Ge$, $Mg_2Sn$ and $Mg_2Pb$. The methods are further applicable to such semiconductor bodies as ZnSb, CdSb and many other inter-metallic compounds of semiconductor character. While with such bodies the solubility of the components in the basic lattice of the semiconductive compound is larger than with the compound $A_{III}B_V$, the solubility is not so large as to prohibit the use of the components as electrode materials.

Compounds of the type $A_{III}B_V$ differ advantageously from the above-mentioned other compounds also by the fact that the thermodynamic equilibrium adjusts itself virtually spontaneously.

The above described methods, according to the invention, are particularly advantageous when the substances that are to act as donors or acceptors are, as such, poor electric conductors or even insulators. This is the case, for instance, with selenium or sulphur used as a donor within a compound of the type $A_{III}B_V$. These substances, if used by themselves, would not be applicable as electrode materials because of their slight conductivity. However, if traces of these substances are added as substitutional impurities to a conductive component of the semiconductive compound, then this conductive component assumes the function of providing the electric conductance required of the electrode. This is particularly important with semiconductive compounds of the type $A_{II}B_{VI}$ for which the donor substances are not only insulators but, in many cases, are even gaseous or liquid, such as the elements chlorine or bromine.

However, a large number of donor and acceptor substances in semiconductive compounds are very good conductors of electricity or even metallic conductors. We found that in such cases these materials can be used alone as electrode materials. Semiconductor devices are thus successfully produced from compounds of the type $A_{III}B_V$ by using the metals cadmium (Cd) and zinc (Zn) as acceptor contacts, and by using as a donor contact the element tellurium (Te) which is a semiconductor of relatively good conductance. Tin (Sn) has been found useful in many cases for providing an ohmic contact. Mercury (Hg) is likewise well suitable as an acceptor. Since this metal is liquid, it is preferably applied in the form of an amalgam, for instace, cadnimum amalgam. Particularly in the latter case, the mercury may be used for facilitating the fusing of cadmium onto the semiconductive carrier body. Thereafter the mercury may be eliminated by vaporization.

In general, the use of alloys as electrode material affords the possibility of mutually adapting the thermal coefficients of expansion of electrodes and semiconductor bodies.

When producing the electrodes, the following expedients are to be considered. It will be recognized from the phase diagrams of Figs. 3 to 5 that the quantity of semiconductive compound that can be dissolved by the electrode material increases with temperature. The distance of the temperature axis from the liquidus curve is a measure of the quantity of the semiconductive compound that will dissolve in the molten electrode material at a given temperature. Consequently, this distance is also a measure of the depth of penetration of the bounding surface between the melt and the unmolten portion of the carrier body. For obtaining a predetermined depth of penetration, therefore, it is necessary to accurately adjust the temperature and the relative quantity of the electrode material with respect to each other. Since, besides, the dissolution of the semiconductive compound in the molten electrode material, and hence the penetration of the melt into the carrier body, requires a certain period of time, the depth of penetration may also be varied and controlled by varying the period of time during which the semiconductor is maintained at the required temperature. While the semiconductor substance is segregating from the quasi-binary melt consisting of semiconductive material and electrode material, the electrical properties can be additionally modified by regulating the rate of cooling so as to receive a more or less perfect occurrence of thermodynamic equilibrium.

It is furthermore desired to make the bounding surface between the zones 1 and 2 of the semiconductor body as smooth and continuous as possible. To this end, care should be taken to obtain a uniform wetting of the semiconductor surface by the molten electrode material during the fusing operation. This should be done already at a temperature at which the solubility of the semiconductor material in the molten electrode material is still slight. Such a uniform wetting prevents the melt from deeply penetrating at certain points into the carrier body while other points of the surface are not yet sufficiently wetted. A good and uniform wetting of the semiconductor surface can be secured, for instance, when the semiconductor body and the electrode material are subjected to ultrasonic oscillations during the fusing process.

We claim:

1. An electric semicounductor device, comprising a crystalline resistor body of a binary semiconductor compound of an element of the third group with an element of the fifth group of the periodic system of elements, and an electroconductive metallic electrode member fused thereon, said member constituting predominantly one of the elements of said semiconductor compound a portion of the device between the electrode member and the crystalline resistor comprising a re-solidified segregate having the same lattice structure as the crystalline resistor, the segregate having impurities comprising residual, dissolved amounts of the material of the electrode member.

2. An electric semiconductor device, comprising a crystalline resistor body of a binary semiconductor compound of an element of the third group with an element of the fifth group of the periodic system of elements, and an electrode member fused thereon, said member consisting predominantly of a eutectic mixture of the same semiconductor compound with one of its elemental components.

3. An electric semiconductor device, comprising a crystalline resistor body of a binary semiconductor compound of an element of the third group with an element of the fifth group of the periodic system of elements, and an electroconductive metallic electrode member fused thereon, said member constituting predominantly one of the elements of said semiconductor compound and containing donor atoms.

4. A semiconductor device, comprising a crystal of aluminum antimonide, and an antimony electrode fused thereon, said antimony electorde containing lattic-defect atoms.

5. The method of producing an electric semiconductor device, which comprises placing a crystalline body of a binary semiconductor compound of homopolar character in contact with an electrode substance of an element of said binary compound body, heating the electrode substance on said body above melting temperature a sufficient time to dissolve a zone of said compound body in said substance, and permitting the substance and the body to cool whereby the dissolved compound segregates back onto the body.

6. The method of producing an electric semiconductor device, which comprises placing a crystalline body of a binary semiconductor compound of homopolar character in contact with an electrode substance consisting predominantly of a eutectic mixture of said semiconductor compound and one of its elemental components, heating the electrode substance on said body above melting temperature a sufficient time to dissolve a zone of said compound body in said substance, and permitting the substance and the body to cool whereby the dissolved compound segregates back onto the body.

7. The method of producing an electric semiconductor device, which comprises placing a crystalline body of a binary semiconductor compound of homopolar character in contact with an electrode substance consisting of an element of said binary compound and containing substitutional impurity, heating the electrode substance on said body above melting temperature a sufficient time to dissolve a zone of said compound body in said substance, and permitting the substance and the body to cool whereby the dissolved compound segregates back on to body.

8. The method of producing an electric semiconductor device, which comprises placing a crystalline body of a binary semiconductor compound of elements from the third and fifth periodic groups respectively in contact with an electroconductive metallic electrode substance consisting substantially of one of said two elements of the compound, heating the substance on said body above melting temperature a sufficient time to dissolve a zone of said compound body in said substance, and permitting the substance and the body to cool whereby the dissolved compound segregates back onto the body.

9. A semiconductor device comprising a crystal of the homopolar semiconducting compound indium-antimonide (InSb), and an electrode fused thereon, the material of the electrode being a mixture of indium and said indium-antimonide compound.

10. A semiconductor device comprising a crystal of the homopolar semiconducting compound indium-antimonide (InSb), and an electrode fused thereon, the material of the electrode being a eutectic mixture of indium and said indium-antimonide compound, the material of the electrode containing an impurity atom that determnes the electric behavior of the device, said impurity atom being taken from the group consisting of selenium and sulfur.

11. A semiconductor device having a carrier body comprising a crystal of the homopolar semiconducting compound indium-antimonide (InSb), and an electrode fused thereon, the material of the electrode predominantly comprising one of the component elements of said compound, a portion of the device between the electrode and the crystal comprising a re-solidified segregate having the same lattice structure as the crystal of the carrier body.

12. The method of producing an electric semiconductor device, which comprises placing a crystalline body of the homopolar semiconducting compound indium-antimonide (InSb) in contact with an electrode substance comprising one of the component elements of the compound, heating the electrode substance above melting temperature a sufficient time to dissolve a zone of said compound body in said electrode substance, and permitting the substance and the body to cool whereby the dissolved compound segregates back onto the body with its original crystal lattice structure, containing impurities comprisng residual, dissolved amounts of the electrode substance.

13. The method of producing an electric semiconductor device which comprises placing a crystalline body of a binary semiconductor compound of homopolar character, of an element of the third group with an element of the fifth group of the periodic system of elements, in contact with an electroconductive metallic electrode substance consisting predominantly of a eutectic mixture of said semiconductor compound and one of its elemental components, heating the electrode substance on said body above melting temperature a sufficient time to dissolve a zone of said compound body in said substance, and permitting the substance and the body to cool whereby the dissolved compound segregates back onto the body.

14. A semiconductor device comprising a crystal of the homopolar semiconducting compound aluminum antimonide and an electrode fused thereon, the material of the electrode being a mixture of the aluminum antimonide and one of the component elements thereof.

15. A semiconductor device comprising a crystal of the homopolar semiconducting compound gallium antimonide and an electrode fused thereon, the material of the electrode being a mixture of gallium antimonide and one of the component elements thereof.

References Cited in the file of this patent

UNITED STATES PATENTS

| | | |
|---|---|---|
| 2,703,855 | Koch et al. | Mar. 8, 1955 |
| 2,705,767 | Hall | Apr. 5, 1955 |
| 2,735,050 | Armstrong | Feb. 14, 1956 |
| 2,742,383 | Barnes et al. | Apr. 17, 1956 |
| 2,798,989 | Welker | July 9, 1957 |

FOREIGN PATENTS

| | | |
|---|---|---|
| 1,057,038 | France | Oct. 28, 1953 |

OTHER REFERENCES

Welker: Zeitschrift für Naturforschung, pp. 744–749, 1952.